United States Patent [19]

Wong

[11] Patent Number: 4,918,338

[45] Date of Patent: Apr. 17, 1990

[54] DRAIN-BIASSED TRANSRESISTANCE DEVICE FOR CONTINUOUS TIME FILTERS

[75] Inventor: Stephen L. Wong, Scarsdale, N.Y.

[73] Assignee: North American Philips Corporation, New York, N.Y.

[21] Appl. No.: 253,794

[22] Filed: Oct. 4, 1988

[51] Int. Cl.[4] ............................ H03B 1/00; H03K 5/00
[52] U.S. Cl. ........................... 307/521; 328/127; 328/167; 330/109; 330/294; 330/305; 307/568
[58] Field of Search ............ 307/520, 521, 568; 328/127, 167; 330/253, 261, 277, 296, 144, 294, 305, 107, 109

[56] References Cited

U.S. PATENT DOCUMENTS

| | | | |
|---|---|---|---|
| 3,987,293 | 10/1976 | Crooke et al. | 328/167 |
| 4,016,481 | 4/1977 | Bradley | 330/145 |
| 4,045,686 | 8/1977 | Masuda | 307/355 |
| 4,047,059 | 9/1977 | Rosenthal | 307/355 |
| 4,415,864 | 11/1983 | Boeke | 330/253 |
| 4,496,909 | 1/1985 | Knapp | 330/277 |
| 4,509,019 | 4/1985 | Banu et al. | 330/305 |
| 4,710,726 | 12/1987 | Czarnul | 328/127 |

OTHER PUBLICATIONS

Banu et al., "Detailed Analysis of Nonidealities in MOS Fully Integrated Active RC Filters . . . ", IEEE Proceedings, vol. 131, No. 5, 10/84, pp. 190–196.
Tsividis et al., "Continuous-Time MOSFET-C Filters in VLSI", IEEE J. Solid-State Circuits, vol.-SC-21, No. 1, 2/86, pp. 15–29.

Primary Examiner—Stanley D. Miller
Assistant Examiner—Timothy P. Callahan
Attorney, Agent, or Firm—Bernard Franzblau

[57] ABSTRACT

A tunable drain-biased transresistance (DBT) device for generating accurate linearly variable RC values employs first and second matched MOS transistors connected in first and second series circuits with third and fourth matched MOS transistors, respectively, across the terminals of a source of supply voltage. A differential amplifier has first and second input terminals connected to respective drain electrodes of the first and second MOS transistors and an output coupled via a feedback circuit to at least one of its input terminals. A pair of signal input terminals are connected to the gate electrodes of the first and second transistors so that said input terminals operate into a high impedance. A source of adjustable bias voltage ($V_B$) is connected in common to the gate electrodes of the third and fourth transistors thereby to supply adjustable bias currents ($I_B$) to the drain electrodes of the first and second transistors so as to bias these transistors into their triode regions. The tunable DBT device thereby exhibits a wide dynamic linear input range. The resistance of the device is adjustable in a linear manner by controlling the drain voltage of the first and second transistors by adjustment of the bias current ($I_B$).

13 Claims, 3 Drawing Sheets

DRAIN-BIASSED TRANSRESISTANCE DEVICE FOR CONTINUOUS TIME FILTERS

BACKGROUND OF THE INVENTION

This invention relates to a tunable resistance device useful for implementing various analog signal processing functions and, more particularly, to a drain-biassed transresistance device in an active continuous time filter which provides the filter with a tunable frequency response.

In the field of analog signal processing it is important to be able to monolithically generate RC time constants that are accurate, stable and controllable despite variations in process conditions and variations in temperature. The RC time constants determine crucial values such as timing delays and filter frequencies. Accurate RC time constants have been implemented monolithically in VLSI compatible switching technologies such as charge-coupled devices (CCD) and switched-capacitor filters by means of the controlled sampling and transfer of charge packages at a precise clock frequency ($f_{ck}$). In the switched-capacitor technique the resistance (R) is generated by data sampling and RC can be made to track a fixed clock frequency ($1/f_{ck}$). The switch-capacitor technique has become popular in the MOS analog signal processing field, especially in the development of monolithic filters. One reason for this is that the RC time constants of the basic filter building blocks, such as integrators, can be accurately controlled over varying process and temperature ranges.

Unfortunately, in the switched-capacitor technique accuracy deteriorates rapidly as the signal frequency increases and approaches the clock frequency thereby limiting its utility in high frequency applications. The switched-capacitor technique suffers from a number of drawbacks including, for example, noise folding back into the baseband, the need for antialiasing and smoothing filters, charge injection by the switches, and the presence of switching noise. These drawbacks become more significant as the signal frequency is increased.

In the case of monolithic high frequency applications, continuous time techniques have been gaining in popularity because of the absence of switching problems. Continuous time techniques allow charges to flow continuously in a controlled manner onto a capacitor. The time it takes to charge up this capacitor is used to determine the time constant of the circuit. Two problems to be overcome in such techniques however, are the accurate reproducibility of the RC time constants, and the attainment of a large enough linear operating range so that the signal-to-noise ratio remains sufficiently large. The first of these problems can be solved by using a voltage-controlled active element to generate the R value. Automatic tuning of the RC value is then obtained by means of a phase-locked-loop where the phase of the signal from one such tunable element is compared with that of an external reference clock signal, generally a quartz crystal oscillator. Any difference in frequencies is smoothed out and used as a feedback signal to control the values of other tunable resistor elements. Time constants equal to multiples of the clock frequency can thus be generated. As for the second problem, attempts have been made to linearize the active element. However, the additional circuitry necessary to achieve reliable linearization generally deteriorates the high frequency performance of the circuit.

One solution to the problem of providing a linear tunable resistor element with good frequency performance is to use a MOS transistor as a voltage controlled resistor. By operating a pair of such transistors (M1 & M2) differentially, the second order nonlinear terms in the integrator function can be cancelled. The gate voltage is used to tune or vary the value of R until the correct RC constant is achieved. Such an approach is described on pages 15–29 of an article in the IEEE Journal of Solid State Circuits, vol. SC-21, No. 1, Feb. 1986 by Y. Tsividis et al entitled, "Continuous-Time MOSFET-C Filters in VLSI".

Although accurate and linear operation can be achieved with this last approach, several inherent limitations still exist. First, because both transistors M1 and M2 must remain in their triode regions at all times, the input signal voltage swing must be maintained at least one threshold voltage below the gate voltage. This severely limits the maximum allowable linear range (typically to about ⅓ of the supply voltage), making it necessary to use special pre-scaler and post-scaler circuits. Second, because the input signal is applied to the source-drain junction of the transistor, the input resistance is undesirably low. In an all MOS environment, it is typically difficult to design op-amps that are suitable for driving low resistive loads. Third, to use a PLL technique for automatic tuning typically requires significant chip area, involving such functional blocks as a tunable RC oscillator, a phase comparator and a large smoothing filter.

SUMMARY OF THE INVENTION

It is therefore an object of the invention to provide an electronically controlled resistance element as part of an RC building block especially suitable to provide various high frequency analog signal processing functions.

Another object of the invention is to use a non-linear MOS device in a novel manner so as to achieve a device with a wide range of continuous linear resistance (R).

A further object of the invention is to provide an electronically controllable MOS transistor device whose resistance R is variable in a continuous and linear manner over a wide dynamic range so as to provide good high frequency characteristics, direct on-chip tuning, high input impedance and good linearity over a wide input range.

A still further object of the invention is to provide a new method for generating accurate and controllable RC values for implementing various analog signal processing functions, e.g. filtering.

Another object of the invention is to provide a family of unique building blocks suitable for high frequency continuous time filters which exhibit a high input impedance to the applied signals.

A further object of the invention is to provide a high frequency continuous time filter that can be entirely integrated onto a single semiconductor chip.

Still another object of the invention is to provide an RC building block in which the value of RC automatically tracks clock frequency without the use of a phase-locked-loop.

The foregoing and other objects and advantages of the invention are achieved by means of a drain-biassed transresistance MOS transistor device which makes use of the linear transresistance variation of an MOS transistor operated in the triode region. The input signal is applied to the gate of the MOS transistor and its effective resistance is tunable (adjustable) by controlling the transistor's drain voltage by means of an adjustable bias current applied thereto. The invention makes it possible to provide a family of elementary RC controllable devices suitable for various high frequency analog signal processing applications such as high frequency continuous time filter building blocks.

A preferred embodiment of the invention uses a pair of matched MOS transistors connected in a common source configuration and biassed by two matched current sources coupled to respective drain electrodes of the pair of MOS transistors thereby to adjust the values of the drain voltages. The biasing of the drain voltages of the pair of matched MOS transistors into their triode regions provides a continuously variable linear resistance R created by the differential transresistance of the pair of MOS transistors. The drain voltages of the MOS transistors determine the resistance value R, which is controlled via a bias current ($I_B$) generated on the semiconductor chip by a bias current generator circuit. The bias current generator can be arranged so that the RC product is proportional to a clock frequency (e.g. $1/f_{ck}$).

The invention thus provides a new drain-biassed transresistance (DBT) device as an elementary building block for a wide variety of high frequency analog signal processing devices, such as VLSI-compatible continuous time analog filters (e.g. antialiasing filters or smoothing filters), modulator/demodulator in data transmission apparatus and as a stero decoder in an audio system. In general, a DBT filter can be used in applications that presently use switched-capacitor filters, e.g. speech analysis and synthesis, mobile transceivers, radar and sonar devices, orthogonal transforms, automatic inspection systems, etc.

The novel DBT devices to be described provide good RC controllability and high frequency response, a large linear input range (about ⅔ of the supply voltage in one experimental device), high input impedance, ease of tuning, integration of entire video signal processing functions onto a single chip to cut costs and increase reliability, and the ability to make RC track $1/f_{ck}$ without using a phase-locked-loop.

BRIEF DESCRIPTION OF THE DRAWING

The invention will now be described in greater detail by reference to the accompanying drawings in which.

DESCRIPTION OF THE PREFERRED EMBODIMENTS

Figure 1:
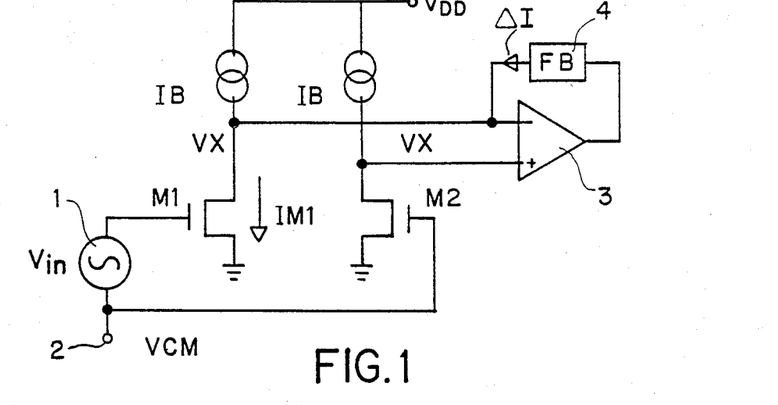
FIG. 1 shows a single-ended version of a DBT element which illustrates the basic concept of the invention.

FIG. 1 illustrates the basic elementary DBT tunable RC element suitable for use as the basic building block in high frequency continuous time filters and other high frequency analog signal processing devices. The circuit of FIG. 1 shows a single-ended version of the basic DBT element. It consists of a matched pair of MOS transistors M1 and M2 connected in a common source configuration. First and second matched current sources $I_B$ are connected in series with the transistors M1 and M2, respectively, between a source of DC supply voltage $V_{DD}$ and a common ground connection. The current sources set the drain voltages of transistors M1 and M2 to a voltage value VX. The value of bias current $I_B$ is adjusted so that the transistors M1 and M2 operate deep into the triode region thus ensuring a large linear operating range.

The source 1 of input signal ($V_{in}$) is coupled to the respective gate electrodes of MOS transistors M1 and M2 whereby complementary signals are applied to the gates of M1 and M2. A quiescent voltage VCM, typically approximately $V_{DD}/2$, is applied to each gate electrode from a terminal 2. The drain electrode of transistor M1 is connected to the inverting input (−) of an op-amp 3 and the drain electrode of transistor M2 is connected to the non-inverting input (+) of the op-amp. A feedback circuit 4 couples the output of the op-amp to its inverting input. The relationship between the current $I_B$ and the voltage VX can be shown to be $$I_B = \beta[(VCM - V_{th})VX - \tfrac{1}{2}VX^2] \qquad (1)$$

where $\beta$ and $V_{th}$ are the gain factor and threshold voltage of the MOS transistors.

When an input signal $V_{in}$ from the voltage source 1 is added to VCM into the gate of transistor M1, a current that is greater than $I_B$ is forced to flow through transistor M1. Since the op-amp will maintain the same voltage across its two input terminals, the current that flows through transistor M1 becomes $$I_{M1} = \beta[(V_{in} + V_{CM} - V_{th})VX - \tfrac{1}{2}VX^2] \qquad (2)$$

The current difference $\Delta I$ between the currents $I_{M1}$ and $I_B$ must flow directly out of the feedback element 4 and is given by $$\Delta I = I_{M1} - I_B = \beta V_{in} V_x \qquad (3)$$

Equation (3) shows that there is a direct linear relationship between $\Delta I$ and $V_{in}$ and this condition will be satisfied so long as transistors M1 and M2 remain in the triode region. The effective resistance R of this circuit is thus $$R = \frac{V_{in}}{\Delta I} = \frac{1}{\beta VX} \qquad (4)$$

The resistance R can be electrically adjusted by changing the value of VX, where VX is controlled by the bias current $I_B$ in accordance with equation (1). Therefore, the apparatus of FIG. 1 provides a variable resistance that is accurately tunable, e.g. by adjusting the value of the bias current IB, wherein the resistance remains linear and controllable over a wide range of the input signal. Accurate tuning is achieved by controlling the drain voltage (VX) of the MOS transistors (M1 and M2) so that they always operate in their triode regions. As can be seen from equation (1), by keeping the term (VCM-$V_{th}$) fixed, the value of VX can be controlled precisely via the bias current IB. Equation (3) shows that linearity is achieved through cancellation of nonlinear terms of the two matched MOS transistors by forcing the drain voltage of one transistor (M1) to equal the drain voltage of the other transistor (M2) by means of the differential op-amp 3 and by applying complementary signals to the gates of M1 and M2.

The single-ended DBT element of FIG. 1 is made fully differential by applying a negative signal component to the gate of transistor M2 and by having dual feedback paths from the outputs of a fully differential op-amp.

Figure 2:
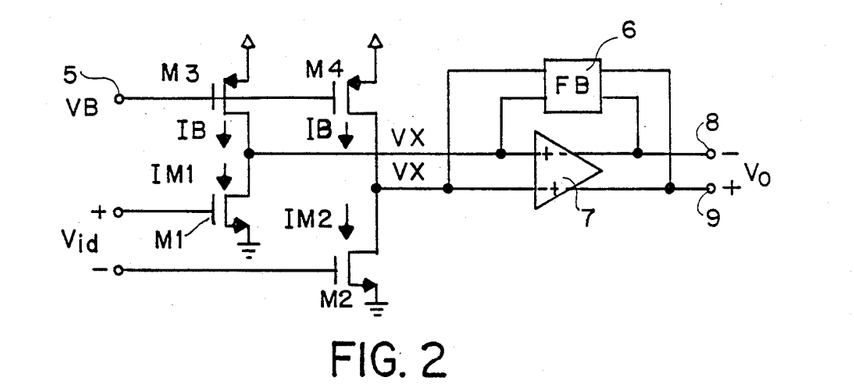
FIG. 2 shows a differential version of a DBT tunable element which can be used as a basic building block for RC filters or the like, FIG. 3 shows a basic gate-input continuous RC integrator using a tunable DBT element.

FIG. 2 shows a basic variable resistance DBT element in which the resistance value R is developed differentially by means of the linear transconductances of a matched pair of MOS transistors M1 and M2 again connected in a common source configuration and biased by respective first and second adjustable constant current sources consisting of p-channel transistors M3 and M4. Transistors M3 and M4 are connected in series with transistors M1 and M2, respectively, between the source of DC supply voltage $V_{DD}$ and ground.

A fixed common-mode voltage $V_{CM}$ is applied to the gate electrodes of transistors M1 and M2 along with the input signal $V_{id}$. The magnitude of the bias current $I_B$ is controlled by a common source of bias voltage $V_B$ applied to the gate electrodes of transistors M3 and M4 from a terminal 5. A feedback circuit 6 couples first and second output terminals of the differential op-amp 7 to respective input terminals (+) and (−) thereof. The feedback circuit 6 maintains the voltages VX at the drain electrodes of transistors M1 and M2 equal. The output signal voltage $V_O$ is taken across output terminals 8, 9.

The drain voltages VX are determined by the product of the bias currents $I_B$ and the on resistances of the transistors M1 and M2 and is kept sufficiently small so that transistors M1 and M2 will both remain in their triode regions even when a large differential input voltage is applied to the input gate electrodes. This feature makes it possible to achieve a large linear range of operation.

A simple analysis of the circuit of FIG. 2 will demonstrate the linearity of its transfer function. If a differential signal $V_{id}$ is applied to the gate electrodes of the transistors M1 and M2, the gate voltages of M1 and M2 are then $V_{CM}+V_{id}/2$ and $V_{CM}-V_{id}/2$, respectively. The drain currents in the transistors M1 and M2 then become $$I_{M1} = \beta\left[\left(\frac{V_{id}}{2} + V_{CM} - V_{th}\right)VX - \frac{1}{2}VX^2\right] \quad (5)$$

$$I_{M2} = \beta\left[\left(-\frac{V_{id}}{2} + V_{CM} - V_{th}\right)VX - \frac{1}{2}VX^2\right] \quad (6)$$

where $\beta$ and $V_{th}$ are the gain factor and threshold voltages of the devices. By subtracting the two currents, the square term dependence on VX is cancelled. This results in a linear relationship between $\Delta I$, given by IM1−IM2, and Vid:

$$\Delta I = \beta V_{id} VX \quad (7)$$

A differential current $\Delta I$ is forced to flow into the two feedback components. This forces a differential output voltage equal to the product of $\Delta I$ and the impedance of the feedback circuit 6. The effective transresistance of this circuit from the input gate voltage to the output drain current is given by $$R = \frac{V_{id}}{\Delta I} = \frac{1}{\beta VX} \quad (8)$$

The value of R can thus be tuned by modifying the value of Vx and $I_B$. Equation (8) is valid even for large signals as long as transistors M1 and M2 remain in their triode regions.

By modifying the feedback element 6, different generic functions can be developed. Monolithic analog filters can be synthesized from a number of generic building blocks such as integrators, fixed gain amplifiers, and damped integrators. Each of these building blocks can be realized with the DBT element of FIG. 2 by using appropriate feedback components.

Figure 3:
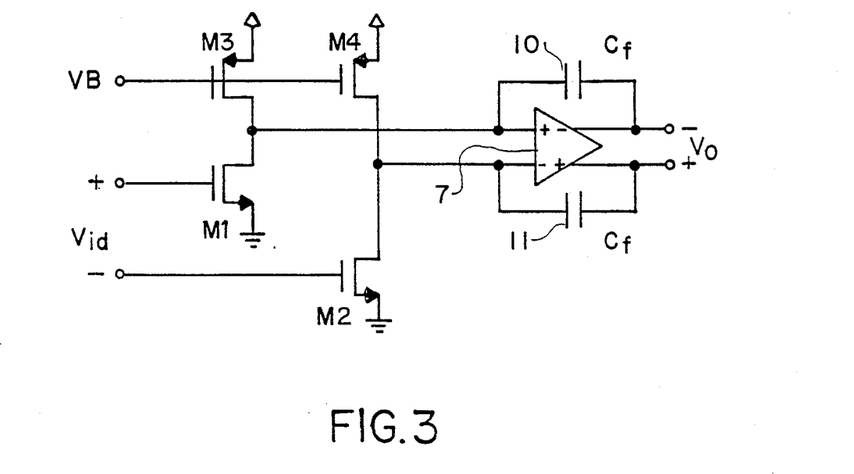

A fully differential embodiment of a negative integrator is shown in FIG. 3. The inverting RC integrator of FIG. 3 is achieved by modifying the feedback circuit of FIG. 2 so as to provide first and second capacitive feedback paths from the outputs of op-amp 7 via respective capacitors 10, 11 to the non-inverting (+) and the inverting (−) inputs, respectively. The differential current from M1 and M2 is forced into the feedback capacitors 10, 11 via the feedback action of the op-amp. The output of the integrator then becomes:

$$V_o = -\frac{1}{C_f}\int \Delta I \, dt = -\frac{\beta VX}{C_f}\int V_{id} \, dt \quad (9)$$

where $C_f$ is the capacitance of capacitors 10 and 11 and $V_{id}$ is the input differential voltage applied between the gate electrodes of transistors M1 and M2. The effective RC time constant of this integrator is given by $$\tau = \frac{C_f}{\beta VX} \quad (10)$$

With the proper $V_B$ bias, achieved through automatic tuning techniques, the time constant can be made invariant to processing and temperature variations.

The magnitude of the bias currents $I_B$ will be sufficient to force both M1 and M2 deep into their triode regions. When a differential input signal (with a common mode voltage $V_{CM}$) is applied to the gates of transistors M1 and M2, then the relationships of equations (5)−(8) also apply to the circuit of FIG. 3. The value of R in equation (8) is then valid even for large signals.

Figure 4:
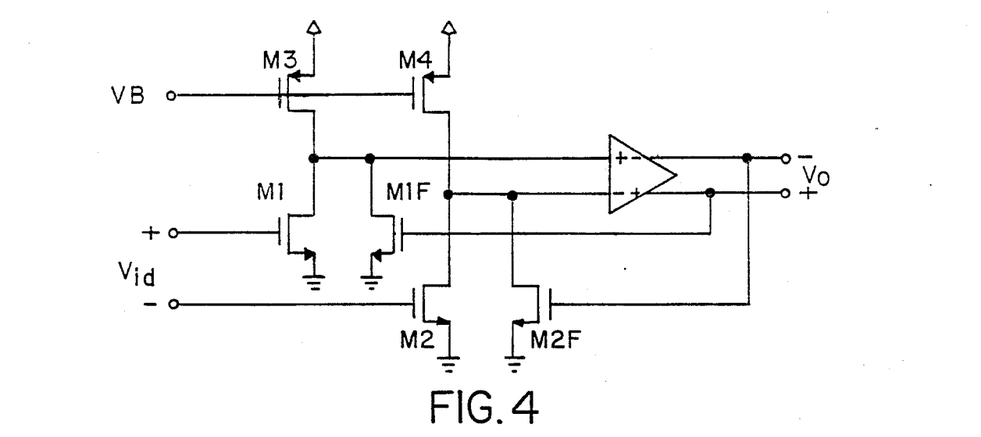
FIG. 4 shows a differential embodiment of a DBT fixed gain amplifier.

FIG. 4 illustrates another basic building block, a DBT fixed gain amplifier. This fixed gain inverting amplifier is realized by substituting a further pair of drain-biassed MOS transistors M1F and M2F as feedback components in place of the feedback capacitors of the DBT integrator of FIG. 3. The feedback transistor M1F is connected in parallel with transistor M1 and the feedback transistor M2F is connected in parallel with transistor M2. The amplifier circuit of FIG. 4 is otherwise similar to the integrator circuit of FIG. 3.

Any $\Delta I$ current forced by the pair of input transistors M1 and M2 will now be compensated by the pair of feedback transistors M1F and M2F so that $$\Delta I_i = \Delta I_f \quad (11)$$

where $\Delta I_i$ and $\Delta I_f$ are currents associated with the input and feedback transistor pairs, respectively. From equations (7) and (11) the following relationship between $V_{id}$ and $V_O$ is valid $$\beta_i V_{id} VX = -\beta_f V_o VX \qquad (12)$$

or $$\frac{V_o}{V_{id}} = -\frac{\beta_i}{\beta_f} \qquad (13)$$

Equation (13) shows that the circuit provides a constant gain even for large signals. In order to keep the value of VX invariant from block to block, the presence of the feedback devices M1F and M2F must be compensated by an appropriate increase in bias current $I_B$. This is achieved by increasing the W/L ratio of the current sources M3 and M4.

Figure 5:
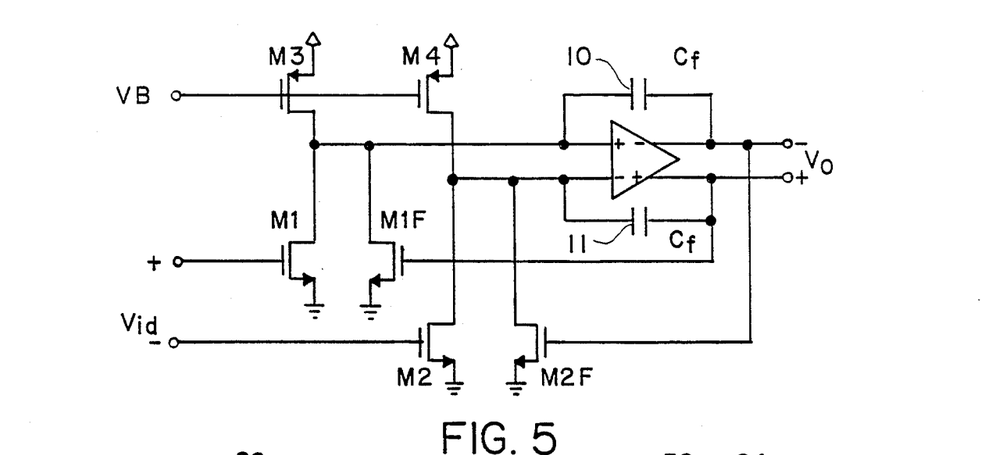
FIG. 5 shows a DBT inverting damped integrator.

A circuit for implementing a DBT damped integrator is shown in FIG. 5. An inverting damped integrator is produced by means of a combination of the feedback elements of the devices shown in FIGS. 3 and 4. Thus, the DBT damped integrator of FIG. 5 includes the feedback capacitors 10, 11, each with a capacitance value $C_f$, of FIG. 3 in combination with the parallel arranged feedback transistors M1F and M2F of FIG. 4. The transfer function of this basic circuit can be shown to be $$\frac{V_o}{V_{id}} = -\frac{\beta_i}{\beta_f} \left[ \frac{1}{1 + \frac{sC_f}{\beta_f VX}} \right] \qquad (14)$$

Being fully differential, any of the three above described inverting building blocks can be changed into a non-inverting equivalent building block by simply interchanging or reversing the two differential output nodes. The six basic DBT building blocks thus constitute a family of tunable elements which can be used to implement various monolithic analog filters, as well as other high frequency analog signal processing functions.

Good frequency performance is achieved from the above building blocks. In each case, the presence of the op-amp forces a virtual ground condition to exist between the drain of M1 and M2. This effectively removes the only possible high impedance node from the signal path, thus preventing any Miller multiplication effects from degrading the frequency response.

In order to demonstrate the functionality of the DBT technique, a single-ended version of the DBT fixed-gain amplifier and the DBT integrator were built using standard components. The single-ended version is functionally equivalent to the differential version except that second order non-linearities are not cancelled as effectively. The DBT single-ended fixed gain amplifier was tested and experimental waveforms were mesasured at the input and output of an amplifier with a gain of $-1$. Using a 10 volt supply, $V_{CM}$ was set at 5V and the linear range of the output signal was over 6V, or roughly ⅔ of the supply voltage. The lower and upper limits of the measured linear range were determined by the points at which the transistors M1 and M1F (FIG. 4) came out of their respective triode regions. A very slight curvature in the output waveform was detected, which translates into less than 10% non-linearity at both extremes.

This curvature in the waveform exists only in the output of the single-ended DBT amplifier and is attributed to the difference in gate voltages between transistors M1 and M1F. The different gate voltages cause different degrees of mobility degradation in $\beta_i$ and $\beta_f$, thus altering the $\beta_i/\beta_f$ ratio of equation (13). In a fully differential circuit, this source of error would not be significant since the same nonlinearity would appear at both outputs of the circuit, and would cancel each other when the output is taken differentially.

In the case of a square wave input, the output waveform of the DBT integrator was again linear over at least a 6V swing. By varying only the bias voltage $V_B$, the RC time constant of the circuit was adjusted to give varying heights to the triangular output wave. The value of the drain voltage VX was adjusted to values of 0.2V, 0.35V, and 0.5V. The experimental results achieved were very good.

The classical approach for achieving automatic tuning is to use a phase-locked loop (PLL). A source of clock voltage with a fixed frequency ($f_{ext}$) is applied to a first input of a phase comparator. The output of the phase comparator is applied to the input of a smoothing filter at whose output a common bias voltage ($V_B$) is developed for all of the tunable RC elements on a semiconductor chip. The bias voltage $V_B$ is also applied as a control input voltage to control the frequency of an RC oscillator, which can also be realized using a DBT element. The output voltage of the oscillator at a frequency $f_0$ is applied to a second input of the phase comparator. When the feedback loop consisting of the phase comparator, the smoothing filter and the RC oscillator achieves equilibrium, then $f_0$ is equal to $f_{ext}$ and all of the RC values of the RC elements on the chip are proportional to $1/f_{ext}$. Since $f_{ext}$ is precisely controlled, all of the RC values are accurate. One drawback of the PLL technique is that it requires the conversion of the output of the phase comparator to a near DC value for $V_B$. This places a high demand on the smoothing filter used in the PLL automatic tuning method.

Figure 6:
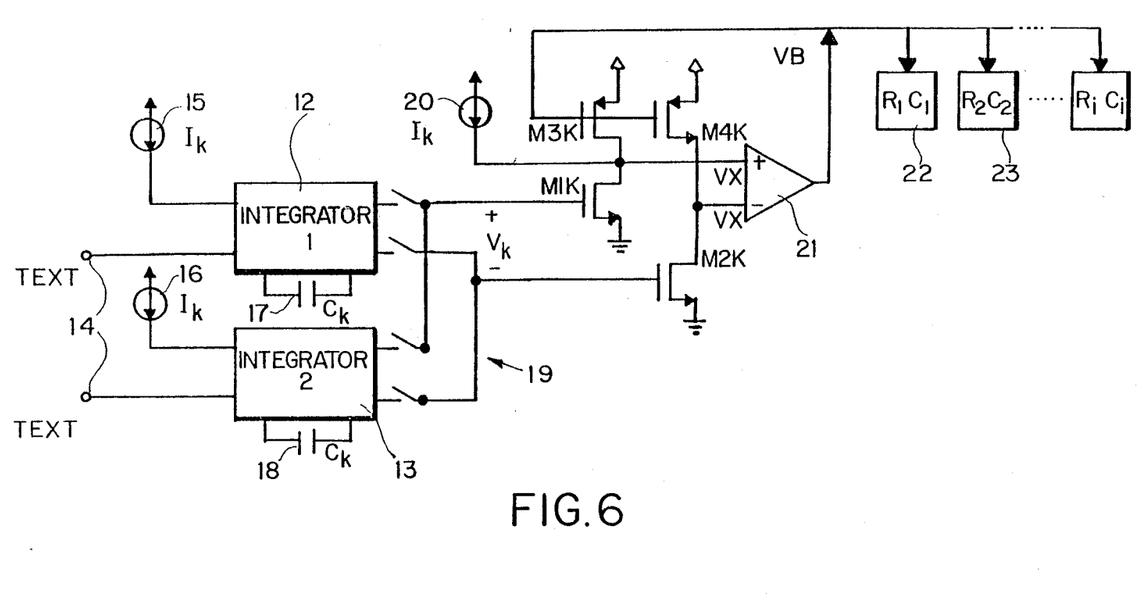
FIG. 6 shows a DBT system which provides automatic tuning for a plurality of tunable DBT-RC elements.

A new automatic tuning circuit shown in FIG. 6 provides an alternate method for automatic tuning that avoids the need for phase comparison and filtering, thus making it possible to use a smaller chip area than is possible with the PLL approach. The RC time constants of all of the DBT elements on the semiconductor chip are controlled simultaneously by means of a common bias voltage $V_B$.

The bias voltage generator in FIG. 6 includes first and second integrators, 12 and 13, respectively. Each integrator has one input that is connected to an external clock source via an input terminal 14. The external clock source has a period $T_{ext}$. Each of the integrators has a second input connected to a respective current source 15, 16 which supplies a current $I_k$, which need not be precise. The integrators also include capacitors 17, 18 each of a capacitance value $C_k$. The outputs of the integrators are connected via a switching device 19 to the gate electrodes of MOS transistors $M1_k$ and $M2_k$, which are part of a DBT stage.

Transistors $M1_k$ and $M2_k$ are connected in series with MOS transistors $M3_k$ and $M4_k$, respectively, between a source of supply voltage and ground. A current source 20 supplies a current $I_k$ to the drain of transistor $M1_k$. The drain electrodes of transistors $M1_k$ and $M2_k$ are connected to the non-inverting ($+$) and inverting ($-$) inputs, respectively, of an op-amp 21. The output of the op-amp provides the bias voltage $V_B$ to the various other tunable DBT RC elements 22, 23 etc., which controls the bias currents $I_B$ of each of these RC elements. The output voltage $V_B$ is also coupled to the gate electrodes of transistors $M3_k$ and $M4_k$ to control the bias currents and thereby the drain voltages (VX) of the transistors $M1_k$ and $M2_k$.

The two integrators alternately charge and discharge the capacitors to provide continuous operation, thereby avoiding the need for a smoothing filter. Each integrator functions to charge up its respective capacitor 17, 18 via its respective current source 15, 16. During the period $T_{ext}$ of the external clock source (not shown) coupled to terminal 14, the capacitor 17 or 18 of capacitance $C_k$ charges to a potential $V_k$, where $$V_k = \left(\frac{I_k}{C_k}\right) T_{ext} \quad (15)$$

If $V_k$ is applied to the differential inputs of the DBT element $M1_k$—$M4_k$, the differential current between transistors $M1_k$ and $M2_k$ would be:

$$\Delta I = \beta_k V_k VX \quad (16)$$

If a current $I_k$ is forced into the drain of $M1_k$, under closed loop conditions, $\Delta I$ would equal $I_k$. Thus $$I_k = \Delta I = \beta_k V_k VX \quad (17)$$

Substituting equation (15) into (17) yields $$I_k = \beta_k T_{ext} \frac{I_k}{C_k} VX \quad (18)$$

which can be simplified to $$\frac{1}{VX} = \frac{\beta_k T_{ext}}{C_k} \quad (19)$$

which is the necessary condition for equilibrium when a bias current $I_B$, determined by the op-amp's output $V_B$, is flowing into transistor $M2_k$. Once the value of $V_B$ is found such that the condition of equation (19) is satisfied, the voltage $V_B$ can be used as a common bias for all of the other DBT elements 22, 23 etc. Each of the time constants can be found by substituting equation (19) into the time constant ($\tau$) equation (10) of each RC block. This results in $$\tau = \frac{C_f}{\beta VX} = \left(\frac{\beta_k}{\beta}\right)\left(\frac{C_f}{C_k}\right) T_{ext} \quad (20)$$

Note that each value of $\tau$ is now the product of two $\beta$ ratios, two C ratios, and $T_{ext}$. Since parameter ratios can usually be controlled quite precisely, and if $T_{ext}$ is a stable, controllable parameter, then all of the time constants in a filter will be stable and controllable.

Figure 7:
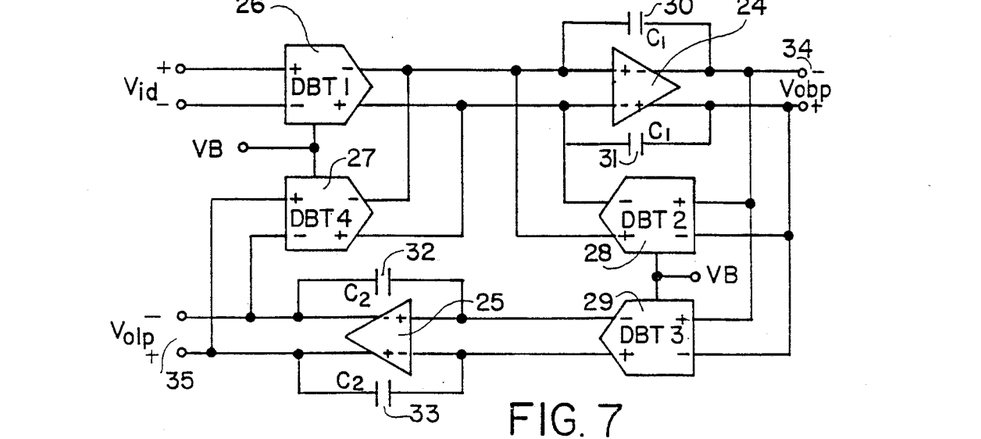
FIG. 7 shows a second order tunable DBT filter.

FIG. 7 shows a second order tunable bandpass/low pass elliptic filter. This is only one example of many filters that can be realized by combining a plurality of tunable DBT elements in accordance with the invention. The filter comprises two differential op-amps 24, 25, four DBT elements 26–29, and four capacitors 30–33. Each op-amp contains a local feedback circuit that sets the output common mode voltage to $V_{CM}$. The nominal band edge frequency of this filter is set at 20 KHz. By adjusting the bias voltage $V_B$, this frequency can be made to vary from about 10 KHz to 40 KHz.

Bandpass and low pass responses are obtained from the outputs 34 ($V_{OBP}$) and 35 ($V_{OLP}$) respectively. For a supply voltage $V_{DD} = 8V$, a linear range close to $\frac{2}{3}$ of the supply voltage can be achieved without any prescaling. And because this circuit is fully differential, the effective signal range can be as large as 10V.

It will be clear from the above description that the DBT device in accordance with the invention provides numerous advantages and unique features which will make it possible to generate accurate and controlled RC values in order to implement various high frequency analog signal processing functions, especially, but not limited to, high frequency continuous time analog filters. It will also be appreciated that various modifications and changes in the preferred embodiments disclosed above will occur to those skilled in the art without departing from the spirit and scope of the invention. Therefore, the appended claims are intended to cover any and all modifications as fall within the spirit of the invention.

What I claim is:

1. A variable resistance DBT device comprising:
    first and second MOS transistors each having a drain electrode and a gate electrode,
    first and second adjustable bias current sources,
    means connecting said first current source and said first transistor in series circuit across terminals of a source of supply voltage and with the drain electrode of said first transistor connected to the first current source,
    means connecting said second current source and said second transistor in series circuit across the terminals of the source of supply voltage and with the drain electrode of said second transistor connected to the second current source,
    a differential amplifier having output means and first and second inputs coupled to the drain electrodes of the first and second transistors, respectively,
    a feedback circuit coupling said output means of said differential amplifier to at least one of the inputs of the differential amplifier,
    a pair of signal input terminals connected to respective gate electrodes of the first and second transistors, and
    means for adjusting the value of bias currents supplied by the bias current sources to the drain electrodes of said first and second transistors thereby to bias the transistors into their triode regions, adjustment of said bias current sources being operative to vary the bias currents and thereby the drain voltages of the transistors so as to linearly vary the effective resistances of said transistors.

2. A device as claimed in claim 1 wherein said first and second transistors are matched MOS transistors and said first and second current sources comprise third and fourth matched MOS transistors having their gate electrodes connected in common to an adjustable source of bias voltage ($V_B$).

3. A device as claimed in claim 2 wherein said differential amplifier output means includes first and second output terminals connected to first and second input terminals of the feedback circuit, wherein the feedback circuit comprises first and second output terminals coupled to said first and second inputs, respectively, of the differential amplifier, and wherein said device comprises first and second output terminals connected to the first and second output terminals of the differential amplifier, respectively.

4. A device as claimed in claim 1 further comprising means for applying a reference voltage to the gate electrodes of said first and second MOS transistors, and wherein said differential amplifier is operative to maintain the drain voltage of one MOS transistor equal to the drain voltage of the other MOS transistor.

5. A DBT integrator device comprising:
first and second matched MOS transistors each having a drain electrode and a gate electrode,
third and fourth matched MOS transistors each having a gate electrode,
means connecting said first and third transistors in series circuit across terminals of a source of supply voltage with the drain electrode of the first transistor forming a common junction with a main electrode of the third transistor,
means connecting said second and fourth transistors in series circuit across the terminals of the source of supply voltage with the drain electrode of the second transistor forming a common junction with a main electrode of the fourth transistor,
a differential amplifier having first and second inputs connected to the drain electrodes of the first and second transistors, respectively,
first and second feedback capacitors each with a capacitance $C_f$,
means connecting the first capacitor between a first output of the differential amplifier and the first input thereof and the second capacitor between a second output of the differential amplifier and the second input thereof,
means connecting the gate electrodes of the third and fourth transistors in common to a terminal for a source of adjustable bias voltage ($V_B$) thereby to provide adjustable bias currents to the drain electrodes of said first and second transistors thereby to bias said transistors into their triode regions, and
means connecting the gate electrodes of the first and second transistors to first and second signal input terminals of the device.

6. A device as claimed in claim 5 further comprising first and second output terminals connected to the first and second output terminals of the differential amplifier and wherein the circuit parameters are arranged so that the effective RC time constant ($\tau$) of the integrator device is:

$$\tau = \frac{C_f}{\beta VX}$$

where $\beta$ is the transistor gain factor and VX the drain voltages of the first and second transistors.

7. A DBT fixed gain amplifier device comprising:
first and second matched MOS transistors each having a drain electrode and a gate electrode,
third and fourth matched MOS transistors each having a gate electrode,
means connecting said first and third transistors in series circuit across terminals of a source of supply voltage with the drain electrode of the first transistor forming a common junction with a main electrode of the third transistor,
means connecting said second and fourth transistors in series circuit across the terminals of the source of supply voltage with the drain electrode of the second transistor forming a common junction with a main electrode of the fourth transistor,
a differential amplifier having first and second inputs connected to the drain electrodes of the first and second transistors, respectively,
a fifth MOS transistor connected in parallel with the first MOS transistor,
a sixth MOS transistor connected in parallel with the second MOS transistor,
means connecting first and second outputs of the differential amplifier to respective gate electrodes of the fifth and sixth transistors,
means connecting the gate electrodes of the third and fourth transistors in common to a terminal for a source of adjustable bias voltage ($V_B$) so as to adjust the bias currents supplied to the drain electrodes of said first and second transistors so as to bias said first and second transistors into their triode regions, and
said first and second output terminals of the differential amplifier comprise first and second output terminals of the device.

8. A device as claimed in claim 7 wherein the device circuit parameters are arranged so that:

$$\frac{V_o}{V_{id}} = -\frac{\beta_i}{\beta_f}$$

where $V_O$ is the output signal voltage, $V_{id}$ is the input signal voltage, $\beta_i$ is the gain factor of the first and second transistors and $\beta_f$ is the gain factor of the fifth and sixth transistors.

9. A DBT damped integrator device comprising:
first and second matched MOS transistors each having a drain electrode and a gate electrode,
third and fourth matched MOS transistors each having a gate electrode,
means connecting said first and third transistors in series circuit across terminals of a source of supply voltage with the drain electrode of the first transistor forming a common junction with a main electrode of the third transistor,
means connecting said second and fourth transistors in series circuit across the terminals of the source of supply voltage with the drain electrode of the second transistor forming a common junction with a main electrode of the fourth transistor,
a differential amplifier having first and second inputs connected to the drain electrodes of the first and second transistors, respectively,
first and second feedback capacitors,
means connecting the first capacitor between a first output of the differential amplifier and the first input thereof and the second capacitor between a second output of the differential amplifier and the second input thereof,
a fifth MOS transistor connected in parallel with the first MOS transistor,
a sixth MOS transistor connected in parallel with the second MOS transistor,
means connecting the first and second outputs of the differential amplifier to respective gate electrodes of the fifth and sixth transistors,
means connecting the gate electrodes of the third and fourth transistors in common to a terminal for a source of adjustable bias voltage ($V_B$) thereby to supply adjustable bias currents to the drain electrodes of the first and second transistors so as to bias said transistors into their triode regions, means connecting the gate electrodes of the first and second transistors to first and second signal input terminals of the device, and first and second output terminals connected to the first and second output terminals of the differential amplifier.

10. An automatic DBT tuning system for one or more tunable DBT-RC elements comprising:

first and second DBT integrator devices each as claimed in claim 4 wherein the gate electrode of at least the first transistor of each integrator is connected to a terminal that receives a clock signal, fifth and sixth matched MOS transistors each having a drain electrode and a gate electrode, seventh and eight matched MOS transistors each having a gate electrode, means connecting said fifth and seventh transistors in series circuit across terminals of a source of supply voltage with the drain electrode of the fifth transistor forming a common junction with a main electrode of the seventh transistor, means connecting said sixth and eighth transistors in series circuit across the terminals of the source of supply voltage with the drain electrode of the sixth transistor forming a common junction with a main electrode of the eighth transistor, switching means coupling the gate electrodes of the fifth and sixth transistors to the outputs of the first and second DBT integrators, a further differential amplifier having first and second inputs connected to the drain electrodes of the fifth and sixth transistors, respectively, and means connecting an output of said further differential amplifier to the gate electrodes of the seventh and eighth transistors and to a bias voltage input terminal of said one or more tunable DBT-RC elements thereby to adjust bias currents and thereby the RC time constant of the DBT-RC elements.

11. A tunable DBT filter comprising:

first, second, third and fourth DBT devices each as claimed in claim 2 with each device having first and second output terminals that comprise first and second output terminals of its respective differential amplifier, first and second op-amps each having first and second input terminals, first and second output terminals, and first and second capacitors connected between its respective first input and output terminals and its second input and output terminals, respectively, means connecting said first DBT device and said first op-amp in cascade between a pair of signal input terminals and a pair of filter output terminals, means coupling the second DBT device in a feedback circuit between the first and second output terminals of the first op-amp and the first and second input terminals thereof, means coupling the third DBT device and the second op-amp in cascade between said pair of filter output terminals and a second pair of filter output terminals, and means coupling said fourth DBT device between said second pair of filter output terminals and the first and second output terminals of the first DBT device.

12. A variable resistance DBT device comprising:

first and second MOS transistors each having a drain electrode and a gate electrode, means for generating at least two adjustable bias currents, a pair of signal input terminals connected to respective gate electrodes of the first and second MOS transistors to apply complementary input signals thereto, means directly coupling said generating means to the drain electrodes of said first and second MOS transistors to supply first and second respective bias currents thereto thereby to control the respective drain voltages in a manner to operate said first and second MOS transistors into their triode regions for a given range of input signals, adjustment of said generating means being operative to vary the drain voltages of the MOS transistors in a manner so as to linearly vary the effective resistance of said transistors, and means coupled to the drain electrodes of the first and second MOS transistors for maintaining the drain voltages of the transistors substantially equal throughout said given range of input signals.

13. A device as claimed in claim 12, wherein said first and second transistors comprise matched MOS transistors, said generating means comprises third and fourth matched MOS transistors connected in first and second series circuits with said first and second transistors, respectively, across terminals of a source of DC supply voltage, and wherein gate electrodes of the third and fourth transistors are connected in common to a terminal of an adjustable source of bias voltage, and wherein said drain voltage maintaining means comprises a differential amplifier having first and second inputs coupled to the drain electrodes of the first and second MOS transistors, respectively, and an output coupled to the drain electrode of at least one of said first and second MOS transistors.

* * * * *

UNITED STATES PATENT AND TRADEMARK OFFICE
CERTIFICATE OF CORRECTION

PATENT NO. : 4,918,338

DATED : Apr. 17, 1990

INVENTOR(S) : Stephen L. Wong

It is certified that error appears in the above-identified patent and that said Letters Patent is hereby corrected as shown below:

Column 13, lines 12 and 17;
  Claim 10, line 4, change "4" to --5--;
           line 9, change "eight" to --eighth--.

Signed and Sealed this

Twelfth Day of May, 1992

Attest:

DOUGLAS B. COMER

*Attesting Officer*     *Acting Commissioner of Patents and Trademarks*